United States Patent [19]
Greeff et al.

[11] Patent Number: 5,210,509
[45] Date of Patent: May 11, 1993

[54] DUAL LOOP PHASE LOCKED CIRCUIT WITH SWEEP GENERATOR AND COMPENSATION FOR DRIFT

[75] Inventors: Roy E. Greeff, Salt Lake City; Bruce H. Williams, Sandy; Mark B. Falslev, South Weber, all of Utah

[73] Assignee: Unisys Corporation, Blue Bell, Pa.

[21] Appl. No.: 891,373

[22] Filed: May 29, 1992

[51] Int. Cl.$^5$ .............................................. H03L 7/12
[52] U.S. Cl. .................................... 331/4; 331/15; 331/17; 331/DIG. 2
[58] Field of Search .................. 331/4, 16, 17, 18, 25, 331/DIG. 2, 15

[56] References Cited

U.S. PATENT DOCUMENTS

| | | | |
|---|---|---|---|
| 4,617,527 | 10/1986 | Naitoh | 331/17 X |
| 4,788,512 | 11/1988 | Hogge, Jr. et al. | 331/17 X |
| 4,970,472 | 11/1990 | Kennedy et al. | 331/17 X |
| 5,091,702 | 2/1992 | Foell | 331/17 X |

*Primary Examiner*—David Mis
*Attorney, Agent, or Firm*—Charles J. Fassbender; Mark T. Starr

[57] ABSTRACT

A dual loop phase locked circuit is disclosed in which a first loop includes a phase detector, a filter, and a VCO; as a second loop includes a sweep voltage generator, a compensation circuit, and the filter of the first loop. Due to the compensation circuit, the VCO accurately tracks a signal from the sweep voltage generator, even though the filter has an electrical parameter that drifts with time and/or age and/or component selection.

10 Claims, 2 Drawing Sheets

DUAL LOOP PHASE LOCKED CIRCUIT WITH SWEEP GENERATOR AND COMPENSATION FOR DRIFT

BACKGROUND OF THE INVENTION

This invention relates to phase locked loop circuits which generate an output signal with a frequency that repeatedly sweeps across a certain frequency band until an input signal having the same frequency as the output signal is detected; and more particularly, it relates to those circuits of the above type which provide compensation for an electrical parameter in the phase locked loop that drifts.

In the prior art, many circuits have been disclosed which employ a sweep circuit with a phase locked loop to generate a signal that sweeps across a band of frequencies. In particular, a computerized search of U.S. patents that contain the words "phase locked loop" AND "sweep circuit" has identified the following sixty-six patents.

| | |
|---|---|
| 1. | 5,091,702 |
| 2. | 5,068,731 |
| 3. | 5,014,340 |
| 4. | 5,013,978 |
| 5. | 4,993,048 |
| 6. | 4,955,083 |
| 7. | 4,942,393 |
| 8. | 4,916,405 |
| 9. | 4,885,632 |
| 10. | 4,876,737 |
| 11. | 4,870,382 |
| 12. | 4,852,123 |
| 13. | 4,852,086 |
| 14. | 4,837,853 |
| 15. | 4,833,416 |
| 16. | 4,817,192 |
| 17. | 4,796,102 |
| 18. | 4,794,623 |
| 19. | 4,774,439 |
| 20. | 4,749,960 |
| 21. | 4,636,736 |
| 22. | 4,591,910 |
| 23. | 4,555,707 |
| 24. | 4,546,388 |
| 25. | 4,514,706 |
| 26. | 4,507,617 |
| 27. | 4,499,434 |
| 28. | 4,497,211 |
| 29. | 4,470,145 |
| 30. | 4,463,288 |
| 31. | 4,434,669 |
| 32. | 4,422,096 |
| 33. | 4,419,760 |
| 34. | 4,413,274 |
| 35. | 4,335,383 |
| 36. | 4,320,356 |
| 37. | 4,316,154 |
| 38. | 4,297,650 |
| 39. | 4,286,286 |
| 40. | 4,275,363 |
| 41. | 4,272,705 |
| 42. | 4,262,264 |
| 43. | 4,253,117 |
| 44. | 4,246,546 |
| 45. | 4,240,100 |
| 46. | 4,220,914 |
| 47. | 4,206,420 |
| 48. | 4,193,030 |
| 49. | 4,146,843 |
| 50. | 4,123,725 |
| 51. | 4,105,932 |
| 52. | 4,104,680 |
| 53. | 4,020,490 |
| 54. | 4,009,448 |
| 55. | 4,007,400 |
| 56. | 3,978,411 |
| 57. | 3,973,250 |
| 58. | 3,958,186 |
| 59. | 3,913,028 |
| 60. | 3,904,817 |
| 61. | 3,902,121 |
| 62. | 3,872,455 |
| 63. | 3,871,020 |
| 64. | 3,793,594 |
| 65. | 3,673,430 |
| 66. | 3,626,426 |

However, of these sixty-six patents, only five also include the word "compensation". Those five patents in the above list are numbered 4, 5, 24, 58, and 62. Each of those patents have been analyzed by present inventor; and none of the five patents disclose a phase locked loop with compensation circuitry which enables the output signal to track a sweep voltage while a circuit parameter in the phase locked loop drifts with time/temperature/component selection. Such a circuit is taught only by the present invention.

BRIEF SUMMARY OF THE INVENTION

The present invention is a dual loop phase locked circuit. Included in the first loop is a phase detector having an input for receiving an external signal, a filter having an input connected to receive an error signal from the phase detector, and a VCO having an input connected to receive a control voltage from the filter plus an output connected to another input of the phase detector. Included in the second loop is a sweep voltage generator which generates a sweep voltage for the VCO to track; and a compensation circuit having one input connected to receive the sweep voltage, having another input connected to receive the control voltage, and having a feedback coupling that sends a feedback current to a node in the filter. This feedback current increases the control voltage as the feedback current increases, and vice-versa. Also, the filter includes a non-ideal circuit component with a parameter that drifts and thereby produces variations in the control voltage. To neutralize these variations, the compensation circuit includes a comparator which increases the feedback current if the control voltage is less than the sweep voltage, and which decreases the feedback current if the control voltage is more than the sweep voltage. In one embodiment, the non-ideal circuit component is an operational amplifier that subtracts a temperature varying offset current from the feedback current.

DETAILED DESCRIPTION

Figure 1:
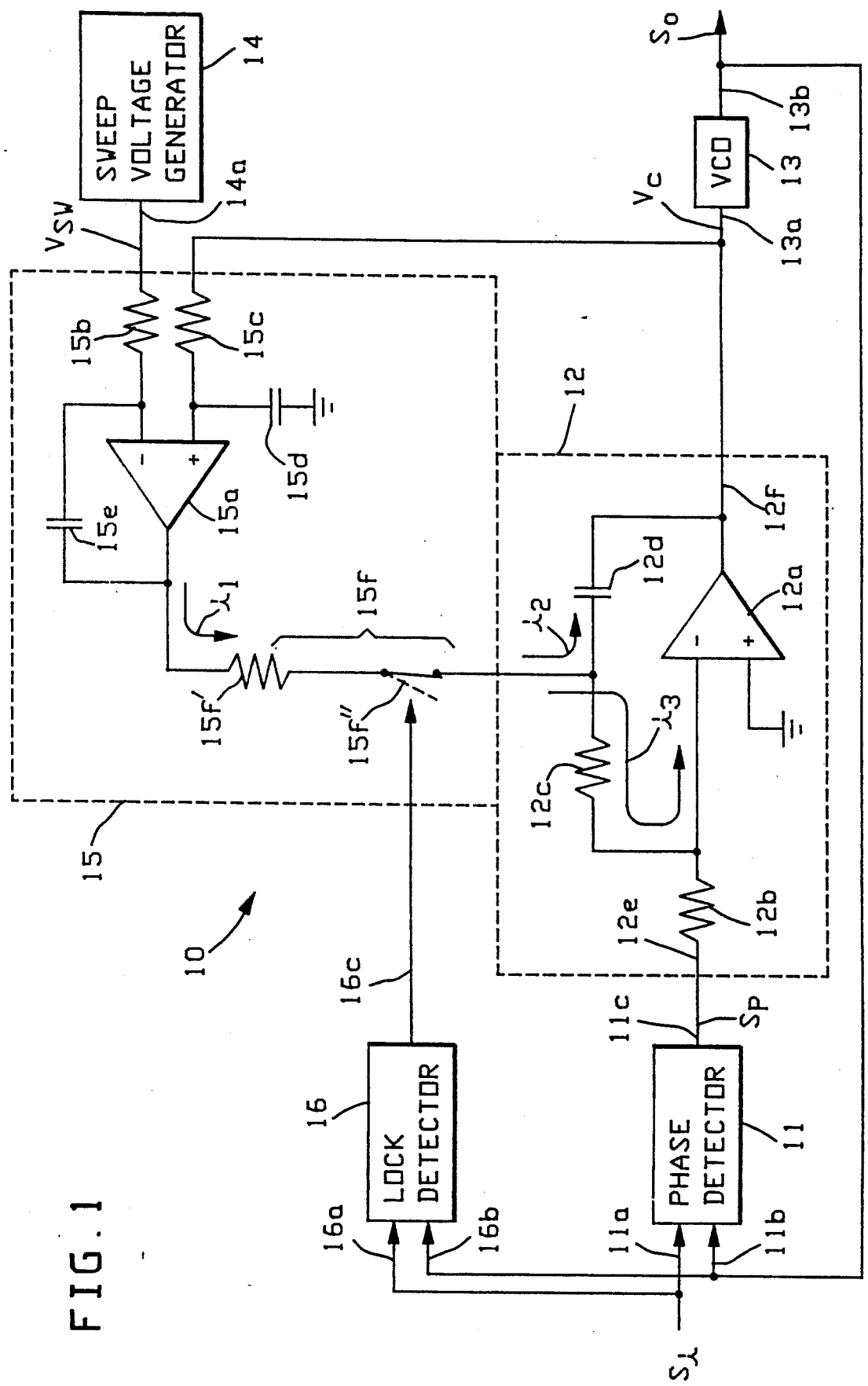
FIG. 1 is a detailed circuit diagram of one preferred embodiment of the invention; and, FIG. 2 is a set of voltage waveforms and current waveforms that illustrate the operation of the FIG. 1 circuit.

Referring now to FIG. 1, a preferred embodiment of a dual loop phase locked circuit 10 which is structured according to the invention will be described in detail. All of the components and their interconnection in this circuit 10 are as follows.

Item 11 is a phase detector which has two inputs 11a and 11b, and which has an output 11c. Input 11a receives an external input signal $S_i$ which has a frequency $f_i$ that lies somewhere within a certain frequency band Δf; input 11b receives an internally generated output signal $S_O$ which has a frequency $f_O$; and in response, the phase detector 11 generates a phase error signal $S_P$ which indicates the difference in phase between the signals $S_i$ and $S_O$.

Item 12 is a filter which includes an operational amplifier 12a, a pair of resistors 12b and 12c, and a capacitor 12d. This filter 12 has an input 12e which is connected to the phase detector output 11c, and it has an output 12f on which a control voltage $V_c$ is generated. In part, the control voltage $V_c$ is generated by filtering the phase error signal $S_P$.

Item 13 is a voltage controlled oscillator (hereinafter VCO). This voltage controlled oscillator 13 has an input 13a which is connected to receive the control voltage $V_c$ from the filter output 12f, and it has an output 13b on which the signal $S_O$ is generated with a frequency $f_O$ that is proportional to the magnitude of the control voltage $V_c$.

Item 14 is a sweep voltage generator that has an output 14a on which a sweep voltage $V_{sw}$ is generated. This sweep voltage $V_{sw}$ varies with time in a sawtooth shaped fashion; and, the range of the voltage $V_{sw}$ represents the frequency band Δf in which the external input signal $S_i$ lies.

Item 15 is a compensation circuit for the sweep voltage generator 14 and the filter 12. This compensation circuit 15 includes an operational amplifier 15a, a pair of resistors 15b and 15c, a pair of capacitors 15d and 15e, and a feedback coupling 15f to the filter 12. The coupling 15f includes a resistor 15f' and an analog switch 15f''. Resistor 15b is connected to receive the sweep voltage $V_{sw}$ from the sweep circuit output 14a; resistor 15c is connected to receive the control voltage $V_c$ from the VCO input 13a; and the feedback coupling 15f supplies an analog feedback current $i_1$ to the filter 12 between the resistor 12c and the capacitor 12d.

Lastly, item 16 is a lock detector circuit. This circuit 16 has two inputs 16a and 16b, and it has an output 16c. Input 16a receives the external input signal $S_i$; input 16b receives the VCO output signal $S_o$; and output 16c generates a logic signal LOCK which opens the switch 15g when the LOCK signal is in a true state (i.e. when the signals $S_i$ and $S_O$ are of the same frequency).

In operation, the phase detector 11, the filter 12, and the VCO 13 comprise a first loop of the dual loop phase locked circuit 10. By this particular loop, phase errors between the signals $S_i$ and $S_O$ are minimized. When a phase error occurs, phase detector 11 generates the phase error signal $S_P$ which indicates the phase difference; filter filters the phase error signal $S_P$ to generate the VCO control voltage $V_c$; and the VCO 13 responds to the control voltage $V_c$ by changing the frequency of the output signal $S_O$ such that the phase error is corrected.

Also in operation, the sweep voltage generator 14, the compensation circuit 15, and the filter 12 comprise a second loop of the dual loop phase locked circuit 10. By this second loop, the VCO output signal $S_O$ is generated such that its frequency $f_O$ repeatedly sweeps across the frequency band Δf in which the external input signal $S_i$ lies. When the lock detector 16 determines that the signals $S_O$ and $S_i$ are of the same frequency, the LOCK logic signal goes true and opens the switch 15f. Then, the first loop operates by itself to correct any phase errors between the $S_O$ and $S_i$ signals.

Figure 2:
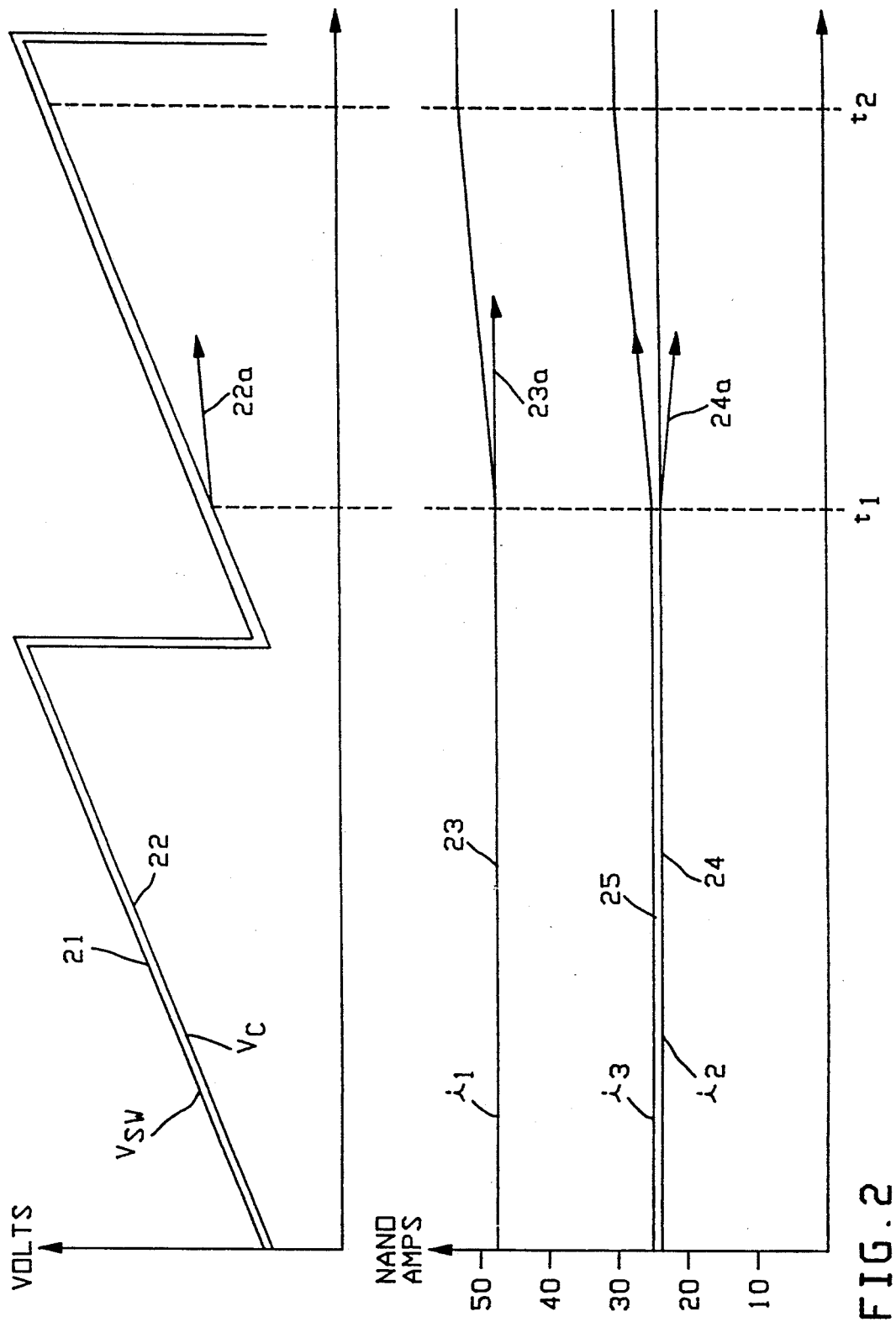

Various signals that occur within this second loop of the FIG. 1 circuit are shown in FIG. 2. There, the sweep voltage $V_{sw}$ from the generator 14 is shown by waveform 21; and, the VCO control voltage $V_c$ is shown by waveform 22 as tracking the sweep voltage. This tracking occurs due to the operation of the compensation circuit 15 and the filter 12.

Specifically in the compensation circuit, the components 15a-15e operate as a comparator which compare the sweep voltage $V_{sw}$ to the control voltage $V_c$, and in response, that comparator generates an analog current $i_1$. If voltage $V_{sw}$ is more than voltage $V_c$, then the current $i_1$ is generated in the direction shown in FIG. 1 with an amplitude that increases as the difference between the voltages $V_{sw}$ and $V_1$ increases. Conversely, if voltage $V_{sw}$ is less than voltage $V_c$, then the current $i_1$ is generated in a direction opposite to that shown in FIG. 1 with an amplitude that increases as the difference between the voltages $V_c$ and $V_{sw}$ increases.

Current $i_1$ is sent through the feedback coupling 15f to the filter 12 at the node between the resistor 12c and the capacitor 12d. Ideally, all of this feedback current $i_1$ charges and/or discharges the capacitor 12f; and in turn, that charging and/or discharging changes the control voltage $V_c$ in accordance with the relation $i = C\, dv/dt$.

Actually, however, only part of the feedback current $i_1$ goes to the capacitor 12d. That part is current $i_2$, and the remainder which is current $i_3$ passes through the resistor 12c and into the operational amplifier 12a. Current $i_3$ is an offset current of the operational amplifier which is unavoidable.

Further, this offset current $i_3$, is a variable which changes with temperature, and with age, and from one amplifier to another. Consequently, the total feedback current $i_1$ cannot simply be increased by a fixed amount to compensate for the offset current. However, in the FIG. 1 circuit, this problem is overcome by the comparator 15a-15e.

In particular, any difference in the voltages $V_{sw}$ and $V_c$ which are caused by the offset current $i_3$ is sensed by the comparator; and in response, the feedback current $i_1$ is adjusted in magnitude and/or direction to eliminate that difference. This operation is illustrated as occurring in FIG. 2 from a time $t_1$ to a time $t_2$.

At time $t_1$, the offset current $i_3$ is shown as ramping up, which for example, could be caused by a change in temperature of the amplifier 12a. If the total current $i_1$ remained constant (as shown by line segment 23a), then the current $i_2$ to the capacitor 12f will ramp down (as shown by line segment 24a, and that in turn will cause the VCO control voltage $V_c$ to stop tracking (as shown by line segment 22a). However, due to the comparator 15a-15e, the total feedback current $i_1$ does not remain constant. Instead, the current $i_1$ changes as explained above, and thus the voltage $V_c$ continues to track the sweep voltage $V_{sw}$.

One preferred embodiment of the invention has now been described in detail. In addition however, many changes and modifications can be made to these details without departing from the nature and spirit of the invention. For example, the sweep voltage generator 14 can generate a sweep voltage $V_{sw}$ which varies with time in a sinusoidal fashion rather than in a sawtooth shaped fashion.

Also, all of the components in the FIG. 1 circuit can have various values. Listed below is one specific set of values which those components have in a particular embodiment that was actually constructed.

TABLE 1

| | |
|---|---|
| phase detector 11 | IQF-2OF-1700B (Merrimac) |
| op amp 12a | 1F147 (National Semiconductor) |
| resistor 12b | 510 ohms |
| resistor 12c | 270 ohms |
| capacitor 12d | 0.0047 microfarads |
| VCO 13 | V61T-4 (Magnum Microwave) |
| sweep generator 14 | see page 3-241 of National Semiconductor Linear Datebook 1982 |
| op amp 15a | LF147 |
| resistor 15b | 1000 ohms |
| resistor 15c | 1000 ohms |
| capacitor 15d | 0.1 microfarads |
| capacitor 15e | 0.1 microfarads |
| resistor 15f | 100K ohms |
| switch 15f' | HI1-0201-2 (Harris) |
| lock detector 16 | IQF-2OF-1700B (Merrimac) |

Accordingly, it is to be understood that the invention is not limited to the details of the above described preferred embodiment but is defined by the appended claims.

What is claimed is:

1. A dual loop phase locked circuit comprising a first loop which includes a phase detector having an input for receiving an external signal, a filter having an input connected to receive an error signal from said phase detector, and a VCO having an input connected to receive a control voltage from said filter plus an output connected to another input of said phase detector; and a second loop which includes:

a sweep voltage generator which generates an analog sweep voltage, separate from said control voltage, for said VCO to track;

A compensation circuit having one input connected to receive said sweep voltage, having another input connected to receive said control voltage, and having a feedback coupling that sends a feedback current to a node in said filter which increases said control voltage as said analog current increases, and vice-versa;

said filter including a non-ideal circuit component with a parameter that drifts and thereby produces variations in said control voltage; and, said compensation circuit including a comparator which neutralizes said variations by increasing said feedback current if said control voltage is less than said sweep voltage, and decreasing said feedback current if said control voltage is more than said sweep voltage.

2. A dual loop phase locked circuit according to claim 1 wherein said non-ideal circuit component is an operational amplifier that subtracts an offset current, which varies with temperature, from said feedback current.

3. A dual loop phase locked circuit according to claim 2 wherein said offset current is at least 20% of said feedback current.

4. A dual loop phase locked circuit according to claim 3 wherein said filter includes a resistor and a capacitor connected in series from an input of said operational amplifier to an output thereof, and wherein said feedback coupling sends said feedback current to a node between said resistor and said capacitor.

5. A dual loop phase locked circuit according to claim 4 wherein said feedback coupling includes an analog switch which closes to pass said feedback current and opens to stop said feedback current.

6. A dual loop phase locked circuit according to claim 5 wherein said sweep circuit generates a sawtooth shaped voltage as said sweep voltage.

7. A dual loop phase locked circuit according to claim 5 wherein said sweep circuit generates a sine wave shaped voltage as said sweep voltage.

8. A dual loop phase locked circuit according to claim 1 wherein said non-ideal circuit component has an electrical parameter that changes said control voltage with temperature.

9. A dual loop phase locked circuit according to claim 1 wherein said non-ideal circuit component has an electrical parameter that changes said control voltage with age.

10. A dual loop phase locked circuit according to claim 1 wherein said variations in said control voltage are at least 20% of said control voltage.

* * * * *